(12) United States Patent
Barrows

(10) Patent No.: US 8,426,793 B1
(45) Date of Patent: Apr. 23, 2013

(54) VISION SENSOR

(76) Inventor: Geoffrey L. Barrows, Washington, DC (US)

( * ) Notice: Subject to any disclaimer, the term of this patent is extended or adjusted under 35 U.S.C. 154(b) by 1147 days.

(21) Appl. No.: 12/245,576

(22) Filed: Oct. 3, 2008

Related U.S. Application Data

(60) Provisional application No. 60/977,460, filed on Oct. 4, 2007.

(51) Int. Cl.
H01L 27/00 (2006.01)
(52) U.S. Cl.
USPC .............. 250/208.1; 250/214 R; 348/308
(58) Field of Classification Search .......... 250/208.1, 250/214.1, 214 R, 214 DC; 348/222.1, 297, 348/299, 308
See application file for complete search history.

(56) References Cited

U.S. PATENT DOCUMENTS

| 7,235,772 | B2 * | 6/2007 | Ko et al. | 250/208.1 |
| 8,045,059 | B2 * | 10/2011 | Kwon | 348/572 |
| 2005/0062853 | A1 * | 3/2005 | Yagi et al. | 348/222.1 |

* cited by examiner

Primary Examiner — Kevin Pyo
(74) Attorney, Agent, or Firm — McDermott Will & Emery LLP

(57) ABSTRACT

A vision sensor capable of generating an array of photoreceptor signals based on a visual field is provided. The vision sensor comprises an array of field circuits. Each field circuit comprises an array of pixel circuits capable of generating an array of potentials based on a visual field and a sample signal, and a control circuit capable of generating the sample signal based on the array of potentials. Each field circuit is also capable of generating an array of photoreceptor signals based on the array of potentials.

20 Claims, 8 Drawing Sheets

VISION SENSOR

RELATED APPLICATION

The present invention claims priority of provisional patent application No. 60/977,460 filed Oct. 4, 2007, the contents of which are incorporated herein in their entirety.

FEDERALLY SPONSORED RESEARCH

This invention was made with Government support under Contract No. W31P4Q06C0290 awarded by the United States Army. The Government has certain rights in this invention.

TECHNICAL FIELD

The teachings presented herein relate to electronic visual sensors.

BACKGROUND

An imaging sensor is a device that is capable of sensing imagery based on light focused thereon. A machine visual sensing system or a vision sensor may be defined as an imaging sensory system having both image sensing and image processing functions, whether these functions are all performed primarily on a single chip or on a multiple chip system. In a "neuromorphic" approach, some or all computations may be performed with analog or mixed-signal circuits (i.e. mixed analog and digital) which exploit the physical dynamics inherent in VLSI (very large scale integration) circuitry and may additionally mimic biological structures. One source that provides such "neuromorphic" approaches is a book entitled "Analog VLSI and Neural Systems" by C. Mead, published by Addison Wesley in 1989. A related approach is to use "vision chips", which are defined herein to be integrated circuits having both image acquisition circuitry and image processing circuitry in the same device, including within the same monolithic die or integrated circuit. One book that provides methods of implementing vision chips is "Vision Chips" by A. Moini and published by Kluwer Academic Publishing in 1999. When either of the above mentioned approaches is properly executed, it is possible to implement a machine vision system capable of performing a given set of tasks in a package substantially smaller than that when utilizing a conventional CMOS (complementary metal-oxide-semiconductor) or CCD (charge coupled device) imager connected to a high-performance processor. Many image processing tasks involve the detection of visual features, such as edges.

Refer to FIG. 1, which illustrates a prior art focal plane array 101 of active pixel circuits, as would be fabricated in a P-substrate/N-well semiconductor process. For purposes of discussion, all circuits in this document will be described for P-substrate/N-well processes. These circuits may be converted for other semiconductor processes. This focal plane array 101 may be fabricated on an imaging chip located at the focal plane of an optical apparatus or a lens, and thus configured to obtain an image from the visual field. The depicted focal plane array 101 has a two-by-two array of active pixel circuits. A two-by-two array is shown in FIG. 1 for purposes of illustration, however a larger array size may be fabricated by adding rows and columns of active pixel circuits. Active pixel circuit 103 comprises a photodiode 111, a sampling capacitor 113, a resetting transistor 115, a sampling transistor 117, a buffering transistor 119, and a selecting transistor 121. The gate of resetting transistor 115 is connected to a global signal nreset 131. The gate of sampling transistor 117 is connected to a global signal samp 133. Signals nreset 131 and samp 133 are global and thus connected to all active pixel circuits in the array 101. The other active pixel circuits are similarly constructed.

Note three symbols used to indicate three types of nodes in the schematic diagram of FIG. 1. Double rectangles, for example that associated with node samp 133, indicate that the node is a global node. All instances of a global node having the same name are electrically connected together. The five-sided symbol connecting to a wire via a point, for example node rowsel1 141, indicates an input port to a circuit. The five-sided symbol connecting to a wire via a flat side, for example the symbol labeled column1 at node 143, indicates an output port from the circuit. Global nodes, input ports, and output ports will be similarly denoted throughout this document.

Photodiode 111 may be formed from a PN junction between the P-substrate, which is tied to Ground 102, and N-doped silicon such as N-diffusion or an N-well. When light strikes photodiode 111, the photodiode 111 sinks current from node 123 to Ground 102 at a rate proportional to the amount of light striking the photodiode 111.

The circuit 101 is operated as follows: First the active pixel circuits are reset by setting global signals nreset 131 and samp 133 to a digital low. This turns on resetting transistor 115 and sampling transistor 117. Node 123 and node 125 become connected together and are set to a potential equal to the power supply voltage Vdd 104. Node 125 is referred to herein as the "sampling node". Setting the sampling node 125 to Vdd 104 discharges the sampling capacitor 113.

Second, signal nreset 131 is set to a digital high. This turns off resetting transistor 115. Nodes 123 and 125 are still connected together via sampling transistor 117 and so will have the same potential.

Third, the active pixel circuits are allowed to integrate. As light strikes photodiode 111, current is sunk from node 123 to Ground. This current charges capacitor 113. Since node 123 and node 125 are connected together via sampling transistor 117, they will together fall in potential as the photodiode 111 sinks current to Ground 102 and as sampling capacitor 113 charges. The more intense the light striking the photodiode 111 is, the faster capacitor 113 will charge and the faster the potential at nodes 123 and 125 will fall. The active pixel circuits will next integrate over a time period called the integration interval.

Fourth, after delaying by the integration interval, the signal samp 133 is set to a digital high. This turns off sampling transistor 117 which disconnects node 123 from node 125 and thus stops the integration of the photodiode's current on sampling capacitor 113. The potential at node 125 will then remain a constant value due to capacitor 113 (except for minute changes due to any leakage currents). The potential at node 125 will contain a reading of the amount of light striking photodiode 111, with a lower potential corresponding to a higher light intensity.

Fifth, the potential at node 125 may be read out by turning on row select line rowsel1 141. This turns on selecting transistor 121, which causes buffering transistor 119 and transistor 151 to form a source follower circuit. Global bias voltage nbias 135 is set to a voltage sufficiently positive to allow the source follower circuit to operate. The resulting signal, called a photoreceptor signal, may be read out at node 143 without significantly affecting the voltage at node 125.

The entire focal plane array 101 may be operated simultaneously, and then individual rows may be read out sequentially. For example, the first through fourth steps above may be performed. Then, in the fifth step when row select line rowsel1 141 is set to a digital high, pixel circuit 103 is read out at output node 143 and pixel circuit 105 is read out at output node 145. Nodes 143 and 145 may also be referred to as column readout lines. The potentials at nodes 143 and 145, when rowsel1 141 is digital high, may be referred to as photoreceptor signals generated by pixel circuits 103 and 105. Then, row select line rowsel1 141 is set to a digital low, and row select line rowsel2 142 is set to a digital high. This allows the other two active pixel circuits to be read out. The act of performing the above steps and reading out the photoreceptor signals over the entire array 101 may be referred to as the act of grabbing an image, including if these photoreceptor signals are recorded or digitized or processed by other circuitry or devices (not shown). The collection of photoreceptor signals generated by all rows of pixel circuits may be referred to as an image.

Care must be taken to select an integration interval for a particular environment. If the integration interval is too long, then active pixel circuits imaging brighter areas of the visual field will saturate since the sampling nodes (e.g. node 125 for pixel circuit 103) cannot drop below a potential based on Ground 102. If the integration interval is too short, then the sampling capacitors in the active pixel circuits imaging darker areas of the visual field will accumulate very small charge, resulting in a poor quality measurement. Typical methods for selecting an integration interval involve grabbing an image with an initial integration interval, and then increasing the integration interval if the grabbed image is too dark or decreasing the integration interval if pixels are saturated.

The prior art focal plane circuit 101 has a significant disadvantage: The dynamic range of light levels that can be concurrently imaged is limited by the fact that the charge across the sampling capacitors (e.g. capacitor 113) is a linear function of light intensity. If some regions of the visual field are very bright while other regions are dim, then the integration interval may be set to optimally image either the brighter areas or the darker areas but not both. This weakness limits the usefulness of the focal plane circuit 101 in many real-world environments that have wide range of light levels.

A second disadvantage of the focal plane circuit 101 is that the photoreceptor signals are analog values and need to be digitized before they can be processed by a processor. It is desirable to have circuits that may perform elementary image processing functions directly in circuitry, so that these functions do not need to be performed on a processor.

BRIEF DESCRIPTION OF THE DRAWINGS

The inventions claimed and/or described herein are further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

DESCRIPTIONS OF EXEMPLARY EMBODIMENTS

The exemplary circuits presented herein are described for implementation in a P-substrate and N-well CMOS (complementary metal-oxide-semiconductor) process. Transistors formed with an N-channel in the P-substrate may be referred to as N-transistors, NFETs (for N-channel field effect transistor), or NMOS transistors. Transistors formed with a P-channel in an N-well may be referred to as P-transistors, PFETs, or PMOS transistors. The schematic symbols for P-transistors are different from those of N-transistors in that they have a small bubble on the gate. Note that the circuits below may be realized in other types of semiconductor processes known in the art and the description presented herein is for illustration purposes and does not limit the scope of the present teaching.

Figure 1:
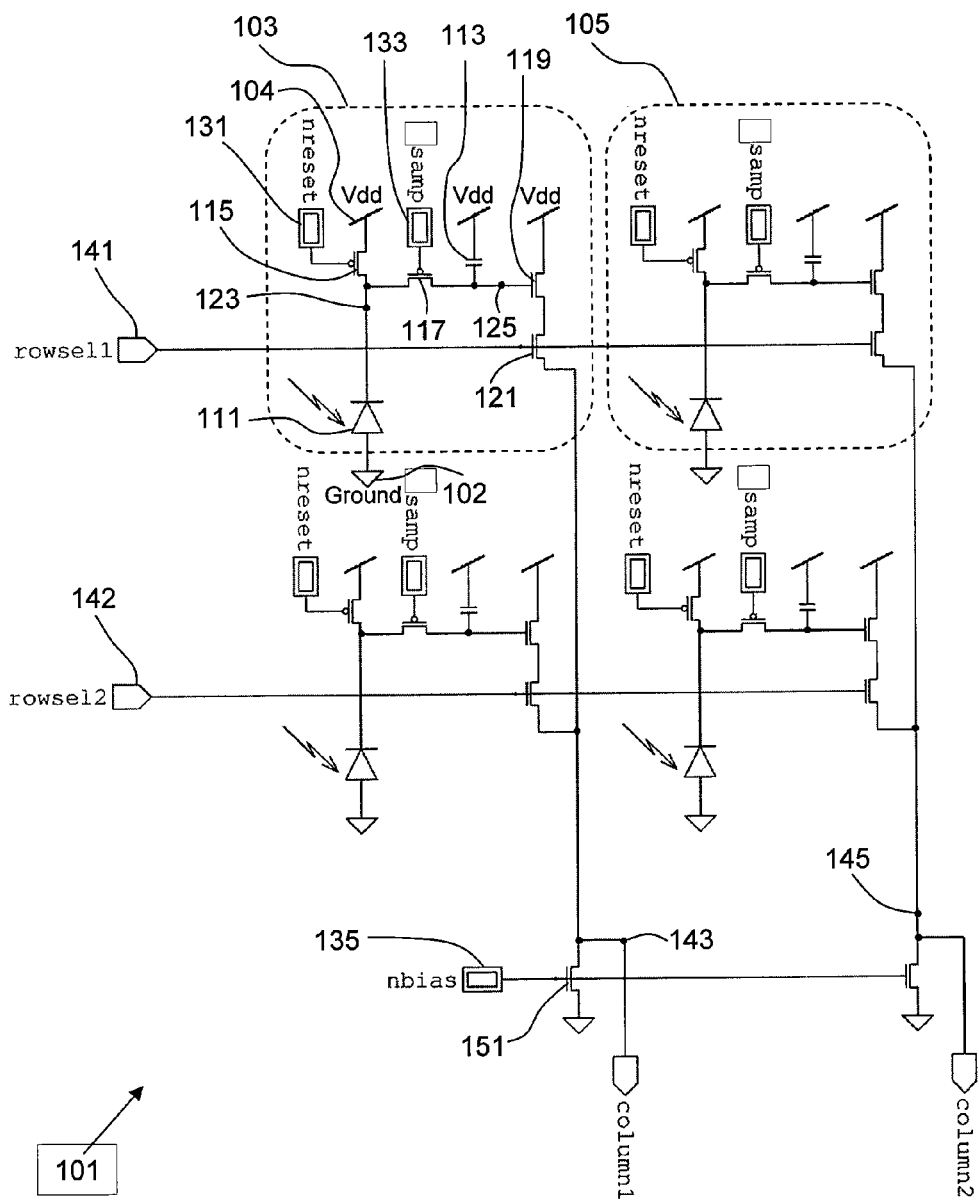
FIG. 1 illustrates a prior art focal plane array of active pixel circuits.
Figures 2A, 2B:
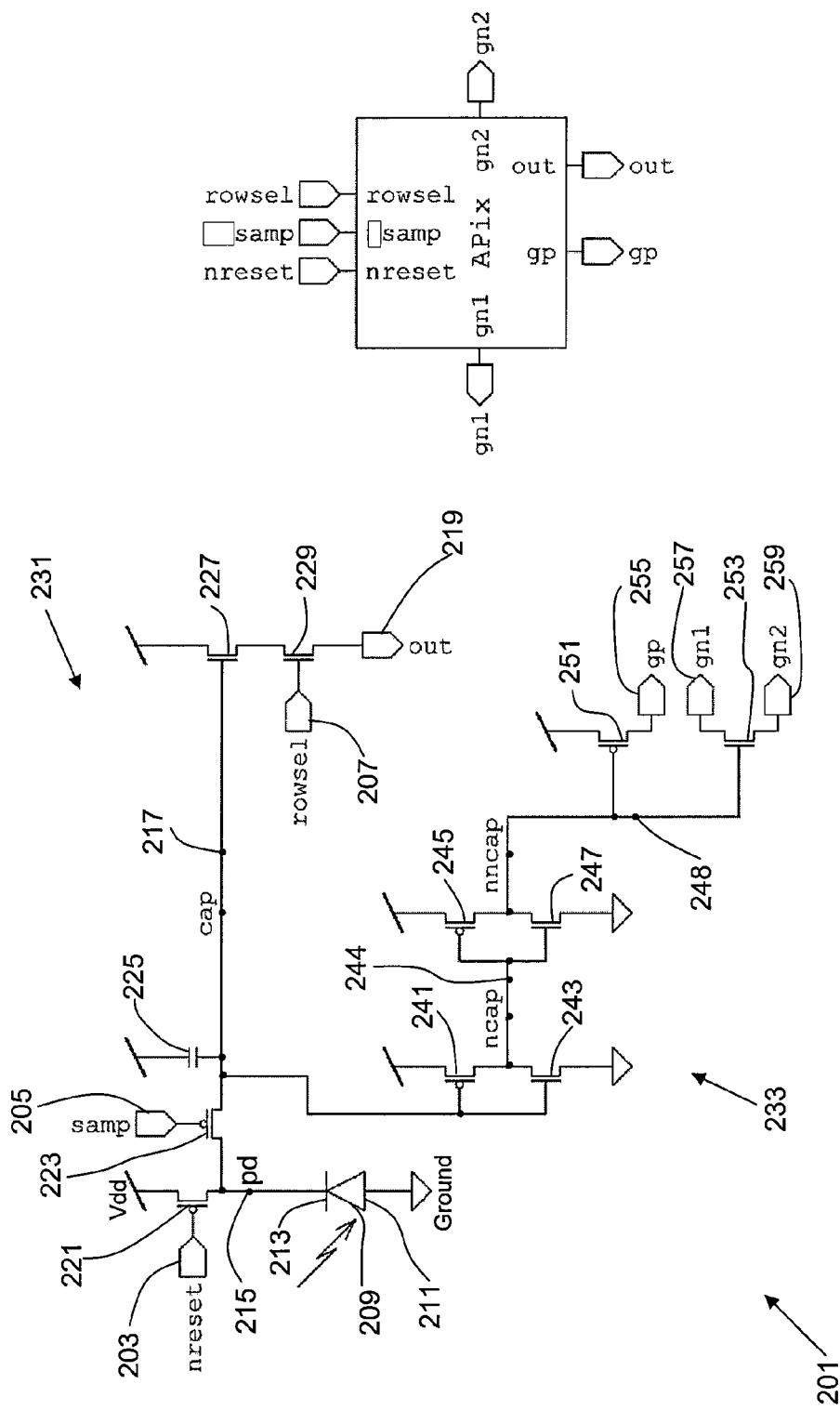
FIG. 2A illustrates an exemplary pixel circuit.
FIG. 2B illustrates a schematic symbol used to signify a pixel circuit according to an embodiment of the present teaching.

Refer to FIG. 2A, which depicts illustrates an exemplary pixel circuit 201. Exemplary pixel circuit 201 receives as input a field reset signal nreset 203, a field sampling signal samp 205, and a row selection signal rowsel 207. The exemplary pixel circuit 201 senses light using a photodiode 209. Photodiode 209 may be constructed with a parasitic N-well photodiode, in which case the P-side 211 of the photodiode 209 is the substrate of a chip while the N-side 213 of the photodiode 209 is connected to node pd 215. Other diode or photoconductive structures may be used for photodiode 209. Transistor 221 is a PMOS transistor that serves as a resetting switch that shorts node pd 215 to the power supply Vdd whenever the field reset signal nreset 203 is a digital low. Transistor 223 is a PMOS transistor that serves as a sampling switch that connects node pd 215 to node cap 217 whenever field sampling signal samp 205 is set to a digital low. A sampling capacitor 225 is connected between node cap 217 and Ground 102. Transistors 227 and 229 form a readout circuit that is used to send the potential at node cap 217 to output node out 219 whenever signal rowsel 207 is set to digital high. Note that the circuit formed by photodiode 209, capacitor 225, and transistors 221, 223, 227, and 229 form an active pixel circuit 231 much like the active pixel circuit 103 of FIG. 1, and may be operated in a similar fashion.

As described above, one weakness of the exemplary active pixel circuit 231 is that it may saturate if the light striking photodiode 209 is too bright, or if the integration interval is too long. Therefore an additional "pixel saturation detection circuit" may be used to detect when the potential at node cap 217 drops below a predetermined voltage. Transistors 241, 243, 245, and 247 form an exemplary pixel saturation detection circuit 233. Transistors 241 and 243 form an inverter, or an "inverting gate", that causes node ncap 244 to rise to a digital high when the node at cap 217 drops below a voltage dependant on the geometries of transistors 241 and 243. Transistors 245 and 247 form a second inverter that sharpens the transition from one digital value to another as the voltage at node cap 217 falls in potential. The result is node nncap 248, which may be referred to as a "pixel saturation signal". Note that the pixel saturation signal nncap 248 does not necessarily alert when an active pixel circuit has saturated, but instead may indicate that the active pixel circuit 231 is close to saturating.

Additional transistors 251 and 253 affect output nodes gp 255, gn1 257, and gn2 259 according to the pixel saturation signal 248. The usage of these transistors and the pixel saturation signal 248 will be apparent below in the discussion of FIG. 3.

Variations of the pixel circuit 201 are possible. For example, N-well photodiode 209 may be replaced with a different photodiode, a phototransistor, or any other photoconductive. Furthermore, the pixel saturation detection circuit 233 may be constructed with different circuits, for example any voltage level detection circuit that detects when the voltage at node cap 217 or at node pd 215 drops below a predetermined voltage. Such a voltage level detection circuit may be implemented with differential amplifier or a comparator with one input connected to a predetermined voltage. Another variation is to delete the capacitor 225 and use the gate capacitance at transistors 227, 241, and/or 243 instead as a sampling capacitor. This may reduce the physical size of the circuit but may add fixed pattern noise. Note that a pixel circuit may be realized using any other implementations known in the art and the description presented herein is for illustration purposes and does not limit the scope of the present teaching.

FIG. 2B illustrates a schematic symbol used hereinafter to signify a pixel circuit 201 according to an embodiment of the present teaching.

Figure 3:
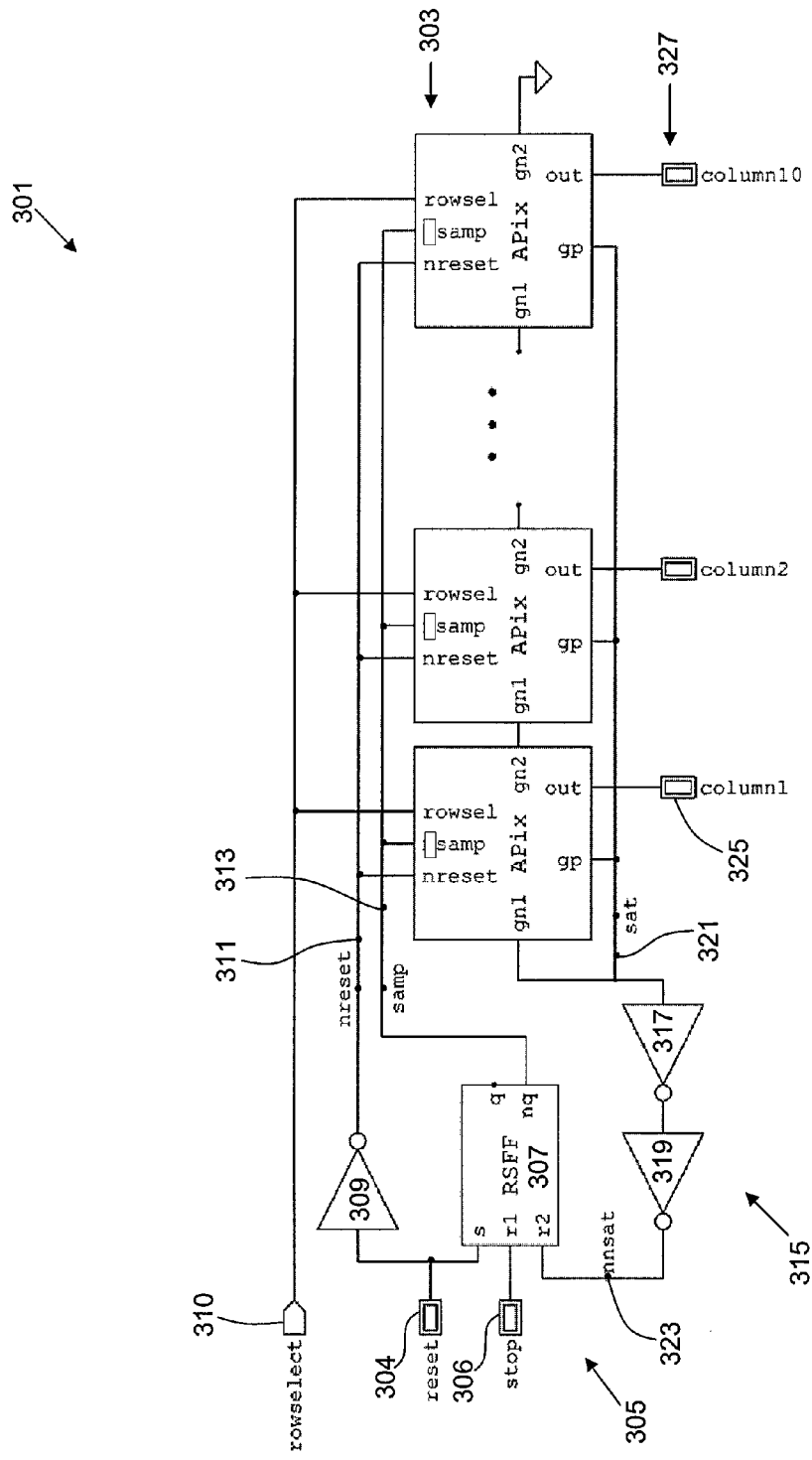
FIG. 3 illustrates an exemplary pixel field circuit.

Refer to FIG. 3, which illustrates an exemplary pixel field circuit 301. The exemplary pixel field circuit 301 comprises an array 303 of exemplary pixel circuits and a field control circuit 305. The field control circuit 305 comprises a flip flop 307 and an inverter gate 309. The exemplary pixel circuit array 303 comprises an array of ten exemplary pixel circuits of FIG. 2A connected together as shown in FIG. 3. The array 303 may obviously be implemented with more or fewer pixel circuits; ten is chosen herein for illustrative purposes. The field control circuit 305 generates a field resetting signal nreset 311 and a field sampling signal samp 313. The field resetting signal nreset 311 provides the pixel reset signal nreset 203 of each exemplary pixel circuit in the array 303, and the field sampling signal samp 313 provides the pixel sample signal samp 205 of each exemplary pixel circuit in the array 303. The field control circuit 305 also receives input from two global nodes reset 304 and stop 306. For reasons that will be made clear below, signal reset 304 may be referred to as an external reset signal and the signal stop 306 may be referred to as an external sample signal.

The exemplary pixel field circuit 301 also comprises a field saturation detection circuit 315, which comprises inverters 317 and 319, and comprises the transistors 251 and 253 of each exemplary pixel circuit of the pixel circuit array 303. The transistors 251 and 253 of each exemplary pixel circuit of the pixel circuit array 303 form a NAND-gate, with an output at node sat 321, when connected as shown in FIG. 3. The node sat 321 is a digital low when all of the exemplary pixel circuits of the pixel circuit array 303 are not saturated. Node sat 321 becomes a digital high when any one of the exemplary pixel circuits becomes saturated or approaches being saturated. Therefore, the potential at node sat 321 may be referred to as a "field saturation signal" that alerts when any one of the exemplary pixel circuits of the array 303 becomes saturated. The inverters 317 and 319 buffer the signal sat 321 to form the signal nnsat 323.

The flip flop 307 is any digital flip flop configured so that it may be "set" by pulsing its input s to a digital high and may be "reset" by strobing input r1 or input r2 to a digital high. The flip flop 307 is configured so that the setting input s overrides the reset inputs r1 and r2, thus if input s is a digital high the flip flop 307 sets regardless of the inputs r1 and r2. When the flip flop 307 is set, its output q is a digital high and its output nq is a digital low. When the flip flop 307 is reset, its output q is a digital low and its output nq is a digital high. Flip flop 307 may be formed with a latch circuit and combinational logic.

The pixel field 301 may be operated in the manner described below:

First, the external reset signal reset 304 is set to a digital high and the external sample signal stop 306 is set to a digital low. This sets flip flop 307. Field resetting signal nreset 311 and field sampling signal samp 313 will both become a digital low. This resets all of the exemplary pixel circuits of the array 303 and prepares them for measuring light intensity. Also, all of the pixel saturation signals nncap 248 of the respective exemplary pixel circuits will become a digital high. The NAND gate formed by transistors 251 and 253 of the exemplary pixel circuits 303 will output a digital low, causing the field saturation signal sat 321 to be a digital low, therefore the flip flop 307 is not affected.

Second, the external reset signal reset 304 is returned to a digital low. This causes the field resetting signal nreset 313 to become a digital high. The field sampling signal samp 313 generated by flip flop 307 remains a digital low. This starts the integration interval for all exemplary pixel circuits of the array 303.

Third, all of the exemplary pixel circuits may now start responding to light by charging their respective capacitors 225 according to light striking their respective photodiodes 209. The potentials at the respective cap 217 nodes of each exemplary pixel circuit will fall. Exemplary pixel circuits having more light striking them will have their cap 217 node potentials fall at a faster rate. Eventually the potential of one exemplary pixel circuit's cap node 217 will fall sufficiently that the exemplary pixel circuit's respective pixel saturation signal 248 will fall to a digital low, causing the field saturation signal sat 321 to rise to a digital high. This causes node nnsat 323 to rise to a digital high, which resets the flip flop 307. This causes the field sampling signal samp 313 to rise to a digital high. This ends the integration interval for all exemplary pixel circuits of the array 303. The capacitor 225 of each exemplary pixel circuit of the array 303 will now hold a charge based on the amount of light striking each exemplary pixel circuit's respective photodiode 209.

Fourth, the signal stop 306 is pulsed to a digital high and back to digital low. If the flip flop 307 was not already reset, it will be reset now, causing field sampling signal samp 313 to rise. In the event that no exemplary pixel circuits have saturated, perhaps due to dim light levels, the pulsing of the signal stop 306 ends the integration interval. This allows the integration interval to be terminated at a predetermined time.

The operation of the field saturation detection circuit 315 and the field control circuit 305 ensures that the integration interval is ended before any of the exemplary pixel circuits saturate. The integration interval is thus adapted to the brightest light levels striking the exemplary pixel circuits of the array 303.

The pixel measurements of the entire field may be read out using the signal rowselect 310, which is provided to all exemplary pixel circuits of the array 303. The resulting photoreceptor signals are placed onto the column output 325 column1 through column10 327.

The exemplary pixel field circuit 301 of FIG. 3 is just one method of implementing a pixel field circuit. For example, the field control circuit 305 and field saturation detection circuit 315 may be implemented using different circuitry. Instead of inverters, the field saturation detection circuit 315 may comprise a comparator or a voltage level detection circuit that detects when the voltage at node cap 217 crosses a predetermined value. Other embodiments may wait for several pixel circuits to approach saturation before ending the integration interval. Note that a pixel field circuit may be realized using any other implementations known in the art and the description presented herein is for illustration purposes and does not limit the scope of the present teaching.

Figure 4:
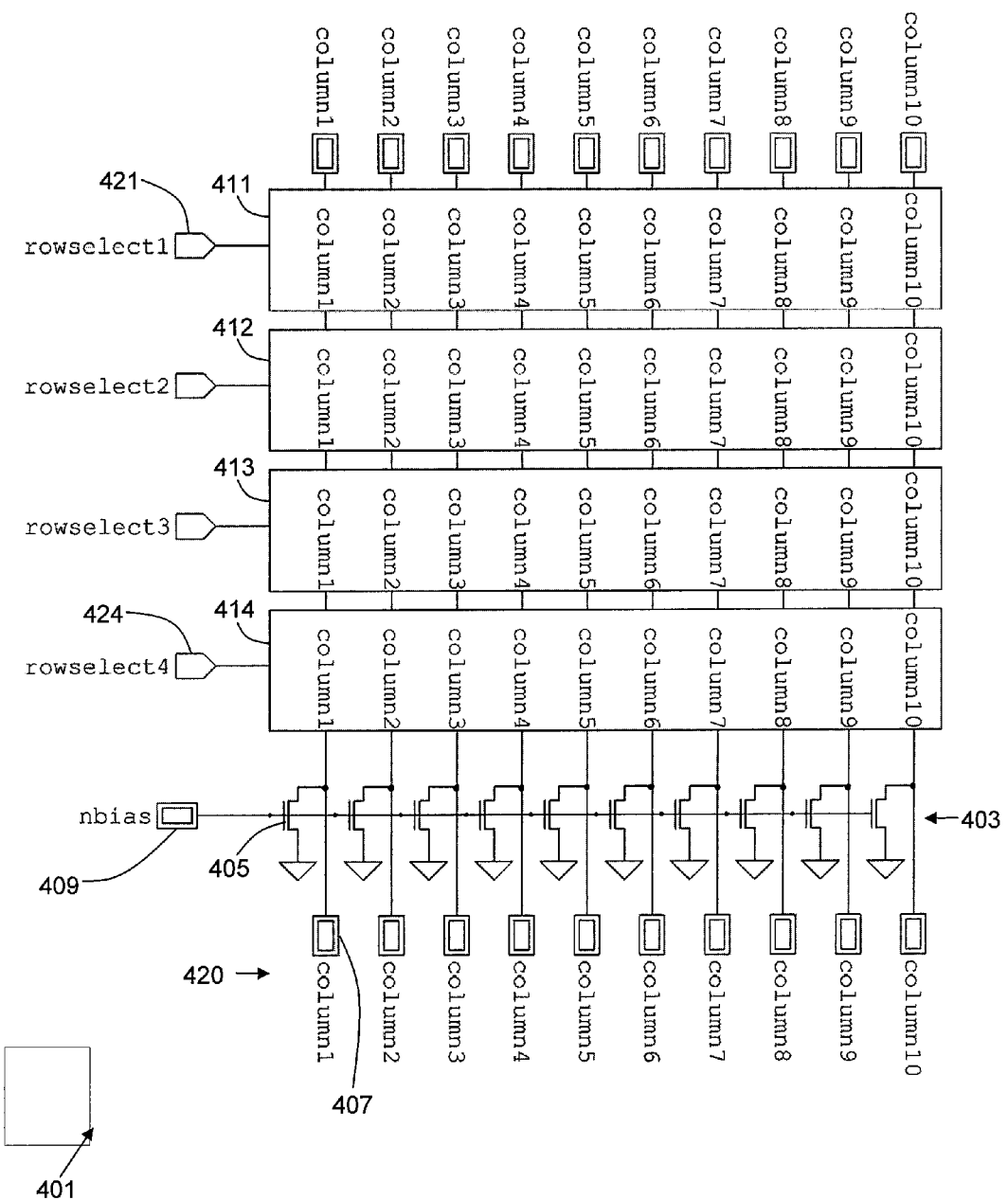
FIG. 4 illustrates an exemplary focal plane circuit.

Refer to FIG. 4, which illustrates an exemplary focal plane circuit 401. The exemplary focal plane circuit 401 as shown comprises four exemplary pixel fields 411, 412, 413, and 414 of the type shown in FIG. 3, and an array of 10 column readout transistors 403. The column readout transistors 403 are biased by global node nbias 409 to act as current sources, and operate like the column readout transistor 151 of FIG. 1. Each column readout transistor connects to its corresponding column line. For example, column readout transistor 405 connects to column readout line column1 407, which connects to the column1 325 line of each exemplary pixel field circuit 411, 412, 413, and 414. The exemplary focal plane circuit 401 also has four row selection signals rowselect1 421 through rowselect4 424 that may be used to connect a row of pixel circuits to the column lines. When one of the row selection signals is set to a digital high, photoreceptor signals based on the selected exemplary pixel field circuit are placed onto the column readout lines 327 column1 through column 10 in a manner similar to that of FIG. 1. These photoreceptor signals become the outputs of the exemplary focal plane circuit 401.

All four of the pixel fields of FIG. 4 are operated by the same global external reset signal reset 304 (not shown in FIG. 4) and the same global external sample signal stop 306 (not shown in FIG. 4). When reset 304 is pulsed high, all of the exemplary pixel field circuits are reset and may start integrating. Each individual pixel field circuit will stop integrating when one of the pixel circuits in the pixel field circuit approaches saturation, causing its respective field saturation signal 321 to rise. Each pixel field circuit will therefore have an independent integration interval based on the amount of light striking the photodiodes in the pixel field circuit. All pixel fields that are still integrating may have its integration interval stopped by strobing the external sample signal stop 306. After the pixel fields are reset, each field of pixels may then measure the light striking their corresponding pixel circuits.

The exemplary focal plane circuit 401 of FIG. 4 is one example of a focal plane circuit based on the present teachings. Variations are possible. For example, the array sizes may be enlargened to include more pixel circuits in each pixel circuit field, and more pixel circuit fields may be added. The pixel circuit fields themselves may be arranged in a two dimensional array, for example so that columns 1 through 10 are implemented using one set of pixel field circuits, columns 11 through 20 are implemented using a second set of pixel field circuits, and so on.

Another variation is to arrange each pixel field circuit so that its array of pixel circuits 303 is arranged in a two dimensional array rather than as a one dimensional row. The field saturation signal 321 would respond to anyone of the pixel circuits in the two dimensional array approaching saturation. In this variation, each pixel field circuit may need to be connected to multiple row select signals to enable individual pixel rows of each pixel field to be accessed. Yet another variation may be appropriate for focal plane circuits having a substantially larger number of pixels: The focal plane circuit would comprise a two dimensional array of pixel field circuits, and each pixel field circuit would comprise a two dimensional array of pixel circuits. For example a focal plane circuit may comprise an M by N array of pixel field circuits, and each pixel field circuit may comprise an A by B array of pixel circuits. Each pixel field circuit would also comprise its own field saturation detection circuit 315 and field control circuit 305. In this case the focal plane array may comprise an A×M by B×N array of pixel circuits divided up into A×B pixel field circuits.

Note that a focal plane circuit may be realized using any other implementations known in the art and the description presented herein is for illustration purposes and does not limit the scope of the present teaching.

Figures 5A, 5B:
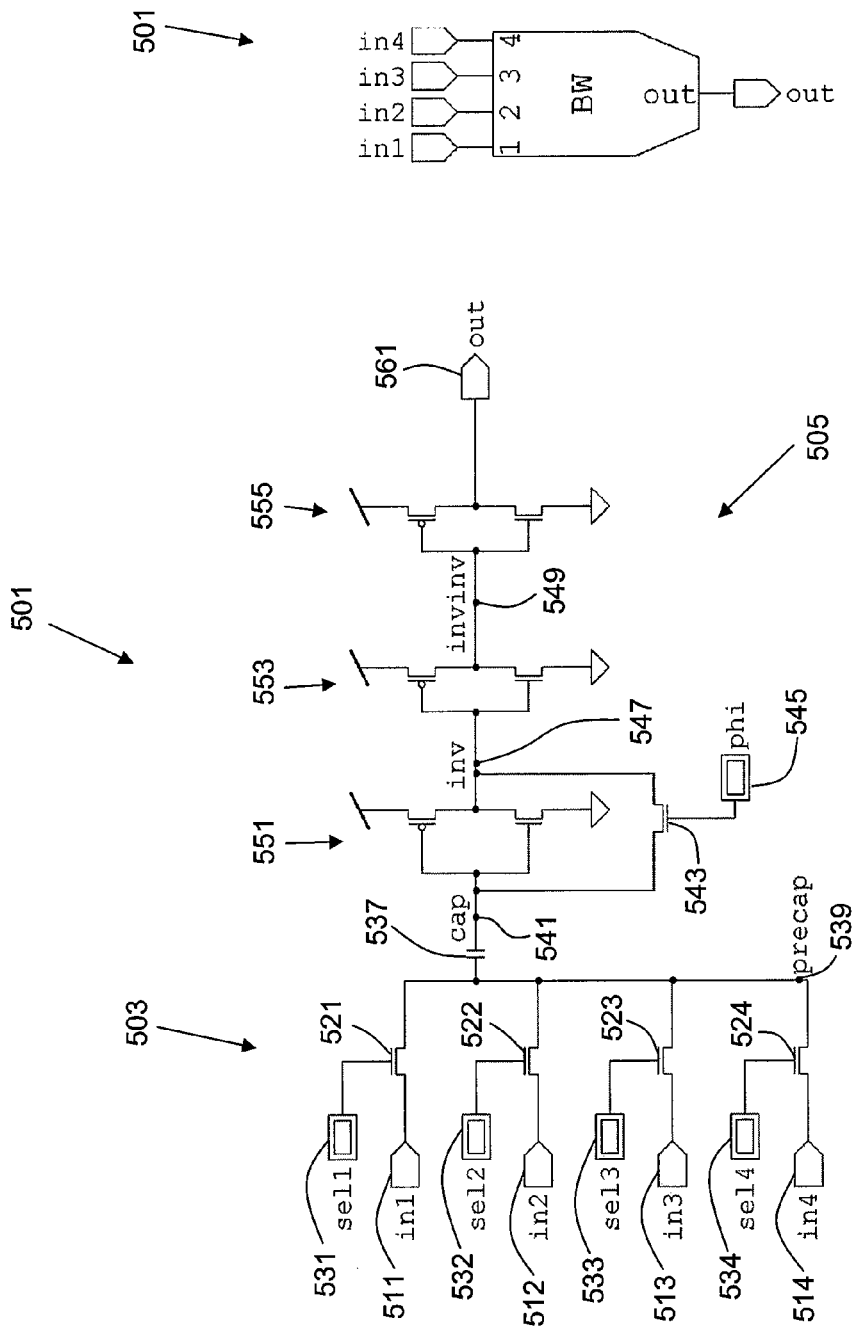
FIG. 5A illustrates an exemplary binary generator circuit.
FIG. 5B illustrates an exemplary schematic symbol used to signify a binary generator circuit.

In the exemplary embodiment, the function of a binary generator circuit is to receive as input one or more photoreceptor signals, or other substantially analog inputs, and generate a binary value based on the photoreceptor signals. Refer to FIG. 5A, which illustrates an exemplary binary generator circuit 501.

The first section of the exemplary binary generator circuit 501 is the input section 503, which comprises four analog inputs in1 511 through in4 514, four input transistors 521 through 524, four global switch signals sel1 531 through sel4 534, and a capacitor 537. The input section 503 is arranged as shown in the figure so that one of the analog inputs may be connected to capacitor 537 at node precap 539. The switch signals sel1 531 through sel4 534 determine the input to which capacitor 537 is connected. For example, when switch signal sel1 531 is high, and the other three switch signals sel1 532 through sel4 534 are low, node precap 539 is connected to input in1 511 via transistor 521. In this case, it is said that "capacitor 537 is connected to input in1 511".

The second section of the exemplary binary generator circuit 501 is the inverter section 505, which comprises three inverters 551, 553, and 555. Each inverter may be formed from a P-transistor and an N-transistor as shown in FIG. 5A. The inverters may also be equal to each other in terms of the geometries of their respective P- and N-transistors. The input of inverter 551 is connected to the right-hand side of capacitor 537 at node cap 541. The input and output of inverter 551 may be shorted together with transistor 543, which occurs whenever global node phi 545 is set to digital high. The output of inverter 551 provides the input to inverter 553 at node inv 547. The output of inverter 553 provides the input to inverter 555 at node invinv 549. The output of inverter 555 becomes output node out 561.

Note that the input section 503 and inverter section 505 together form a switched capacitor circuit that may be used to compare the potential of one analog input with another. This is because capacitor 537 may be "switched" from one input to another. The switched capacitor circuit may be also referred to as a flash comparator circuit. The circuit 501 is one of many possible switched capacitor circuits that may be implemented. The exemplary binary generator circuit 501 may be operated as follows:

First, signal phi 545 is set to digital high, thus closing transistor 543 and shorting together the input and output of inverter 551. When this happens, nodes cap 541 and inv 547 settle to a value between Ground 102 and the Vdd 104 which will be referred to as the "middle voltage" or "Vmid".

Second, one of the four input global switch signals is set to a digital high. As an example, suppose the global node sel1 531 is set high, connecting node precap 539 to input in1 511. Suppose that the potential at node in1 511 is the value Vin1. The voltage across capacitor 537, defined as the potential at node cap 541 minus the potential at node precap 539, will equal the value "Vmid−Vin1".

Third, signal phi 545 is set to digital low, which opens transistor 543 so that the input and output of inverter 551 are no longer shorted together. This also allows node cap 541, on the right-hand side of capacitor 537, to float. In this state the potential across the capacitor 537 does not substantially change and thus remains approximately equal to "Vmid−Vin1". Small deviations from this value may be possible as a result of injection charge from transistor 543 switching off, however this injection charge may be minimized by implementing transistor 543 to have a small gate area, by increasing the size of capacitor 537, and/or by using a pass-gate in place of transistor 543.

Fourth, the currently high global switch signal is turned off, and at the same time (or shortly thereafter) another global switch signal is turned on. To continue the example, suppose global switch signal sel1 531 is turned digital low, and then global switch signal sel2 532 is turned digital high. This would connect the capacitor 537 to input in2 512. Suppose that the potential at node in2 512 is the value Vin2. Because the potential across capacitor 537 is still "Vmid−Vin1", the voltage at node cap 541 will now become:

$$Vcap=Vin2+(Vmid-Vin1)=Vmid+(Vin2-Vin1).$$

Suppose the potential at input in2 512 is more positive than the potential at input in1 511. Then (Vin2−Vin1) is a positive number. This causes the potential at the input of inverter 551 at node cap 541 to be greater than Vmid. This causes node inv 547 at the output of inverter 551 to have a potential significantly less positive than Vmid. This in turn causes the node invinv 549 to have a high digital value, and the node out 561 to have a low digital value.

Now suppose the potential at input in2 512 is less positive than the potential at input in1 511. Then (Vin2−Vin1) is a negative number. This causes the potential at the input of inverter 551 at node cap 541 to be less than Vmid, which in turn causes inverter 551 to output at node inv 547 a potential significantly higher than Vmid. The result is that node invinv 549 will have a low digital value, and the node out 561 will have a high digital value.

When the exemplary binary generator circuit 501 is operated as such, the node out 561 will have a digital high value when Vin1>Vin2 and a digital low value when Vin1<Vin2. In the case of Vin1 is equal to or very close to Vin2, factors such as noise, mismatch between transistors, injection charge in transistor 543, and parasitic capacitance will generally cause the circuit 501 to tend towards either that of Vin1>Vin2 or Vin1<Vin2.

Above we demonstrated how the exemplary binary generator circuit 501 may be used to compare the voltage at input in2 512 with that of in1 511. In the case of the above example, it can be said that the binary generator circuit 501 generates an output using the function "output 1 if Vin1>Vin2, and output 0 otherwise". This function may be referred to as a "binarization function". By properly closing different input transistors in sequence, it is possible to compare any one of the four input signals with any other and thus implement other binarization functions. For example, the binary generator circuit 501 may instead be operated to compute the binarization function "output 1 if Vin3>Vin2, and output 0 otherwise". The binary generator circuit may thus be operated, or "reconfigured" to generate a binary value according to a variety different binarization functions. Because of this, the circuit 501 may also be referred to as a "reconfigurable binary generator circuit".

If the input signals to the binary generator circuit 501 are photoreceptor signals, for example photoreceptor signals generated by the exemplary focal plane circuit 401, then the signal at the output node out 561 may be referred to as a "binarized photoreceptor signal".

FIG. 5B illustrates an exemplary schematic symbol used to signify a binary generator circuit 501, including the location of the inputs in1 511 through in4 514 and the output out 561.

The binary generator circuit 501 shown in FIG. 5A is one of many realizations of binary generator circuit that may generate a binary value based on one or more analog inputs. Any circuit that may be configured to generate one or more binary values based on one or more analog inputs may be referred to as a binary generator circuit. Furthermore, the circuit 501 is one of many realizations of a reconfigurable binary generator circuit that may be reconfigured to generate at least one binary value based on a selectable binarization function. Any circuit that may be reconfigured to generate one or more binary values based on one or more analog inputs according to a selectable binarization function may be referred to as a reconfigurable binary generator circuit. Note that a binary generator circuit or a reconfigurable binary generator circuit may be realized using any other implementations known in the art and the description presented herein is for illustration purposes and does not limit the scope of the present teaching.

The binary generator circuit 501 shown in FIG. 5A is also one of many realizations of a switched capacitor circuit that may be used to generate a binary value based on one or more analog inputs. A switched capacitor circuit is defined hereinafter as any circuit with the following two characteristics: 1) a switched capacitor circuit comprises at least one amplifier or inverter and a network of capacitors and switches, including when the switches are implemented with transistors or pass-gates, and 2) a switched capacitor circuit has the ability to generate one or more output signals based on one or more input signals by using the switches to change how the capacitors are connected in the network. For example, the binary generator circuit 501 is able to compute whether Vin2>Vin3 by reconnecting the capacitor 537 from input in2 512 to in3 513 using switching transistors 522 and 523. Any switched capacitor that is able to generate a binary output based on one or more analog inputs may be used as a binary generator circuit. Note that a switched capacitor circuit may be realized using any other implementations known in the art and the description presented herein is for illustration purposes and does not limit the scope of the present teaching.

Figure 6:
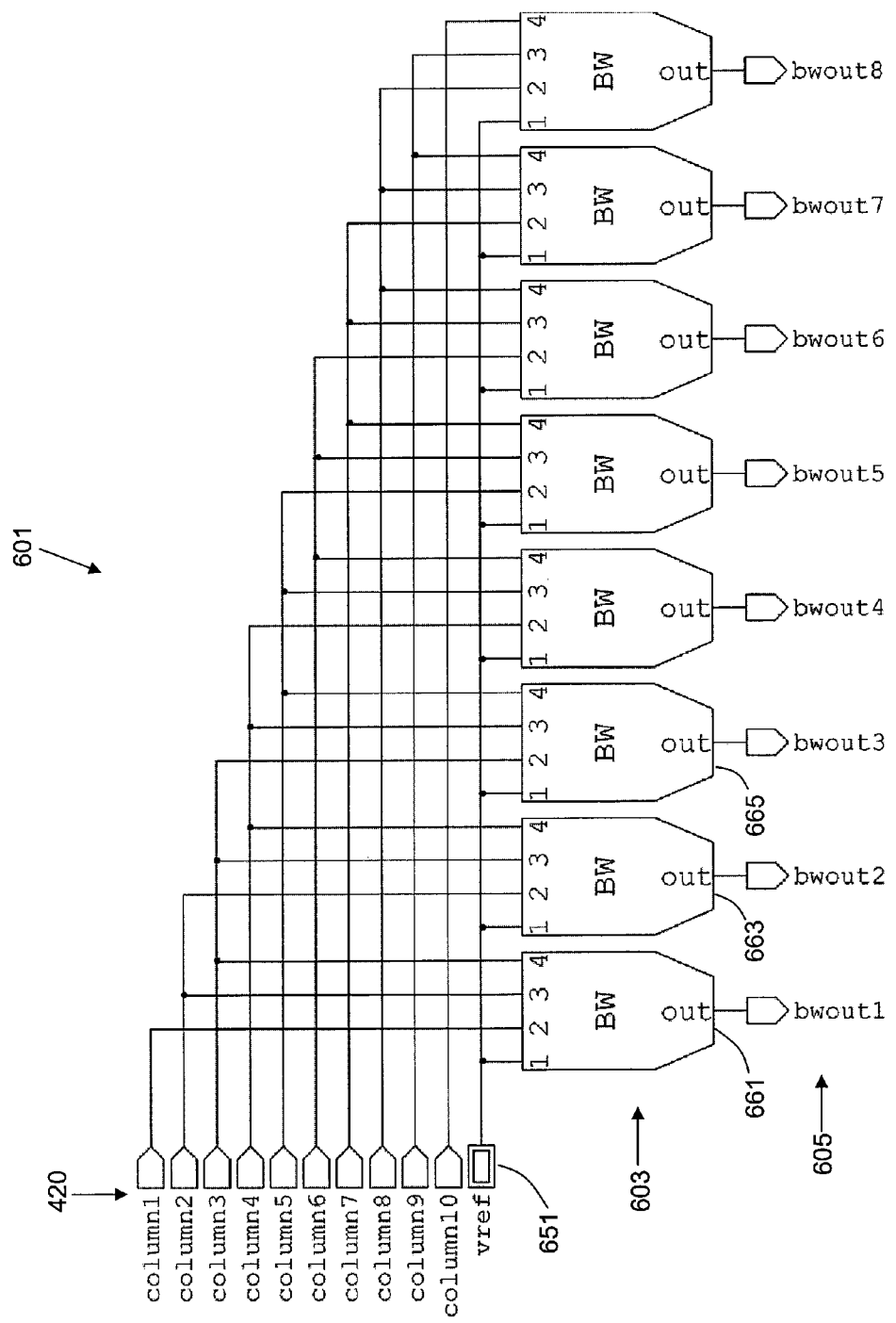
FIG. 6 illustrates an exemplary binary generator array.

A binary generator array is an array of binary generator circuits configured to generate an array of binary signals based on an array of photoreceptor signals (or other analog signals). Refer to FIG. 6, which illustrates an exemplary binary generator array 601 that generates eight binary values based on ten analog photoreceptor signals. This circuit receives as input the ten photoreceptor signals 420 of FIG. 4, and provides them to an array 603 of eight binary generator circuits. The outputs 605 bwout1 through bwout8 of the eight binary generator circuits 603 are thus binarized photoreceptor signals and form the eight bit output of the binary generator array 601. The eight binary generator circuits 603 are connected to the inputs 420 as follows:

First, input in1 511 of every binary generator circuit in the exemplary binary generator array 601 is connected to a common global node vref 651. This enables the comparison of photoreceptor signals to a reference voltage, if this is so desired.

Second, the binary generator circuits in the exemplary binary generator array 601 are connected in a staggered pattern. Inputs in2, in3, and in4 from binary generator circuit 661 are respectively connected to photoreceptor signals column1, column2, and column3. Inputs in2, in3, and in4 from binary generator 663 are respectively connected to photoreceptor signals column2, column3, and column4. Inputs in2, in3, and in4 from binary generator 665 are respectively connected to photoreceptor signals column3, column4, and column5. The remaining binary generator circuits are similarly connected, as shown in FIG. 6. Larger or smaller binary generator arrays having more or fewer binary generator circuits may be similarly constructed.

The function of the exemplary binary generator array 601 is to take as an input the ten photoreceptor signals 420 column1 through column10 and generate eight binarized photoreceptor signals 605 bwout1 through bwout8 based on the ten input signals 420 in a manner selected through usage of the global switch signals sel1 531 through sel4 534 and phi 545. Suppose that the binary generator global signals are driven so that the binarization function computed in the binary generator circuits is "output 1 if Vin3>Vin2, and output 0 otherwise". Suppose that the values of the ten photoreceptor signals 420 are as follows:

column1 potential=2.0 Volts
column2 potential=2.5 Volts
column3 potential=3.0 Volts
column4 potential=2.5 Volts
column5 potential=2.0 Volts
column6 potential=1.5 Volts
column7 potential=2.5 Volts
column8 potential=3.0 Volts
column9 potential=3.5 Volts
column10 potential=2.5 Volts The binary pattern contained by output signals bwout1 through bwout8 will be 11000111 (with bwout1 equaling digital "1" and having the left-hand position in this eight bit word), since column2>column1, column3>column2, column4<column3, and so on.

The exemplary binary generator array 601 shown in FIG. 6 is one of many realizations of a binary generator array that may generate an array of binary values based on analog inputs. Any circuit that may be configured to generate an array of binary values based on an array of analog inputs may be referred to as a binary generator array. Furthermore, the circuit 601 is one of many realizations of a reconfigurable binary generator array that may be reconfigured to generate an array of binary values according to a selectable binarization function. Any circuit that may be reconfigured to generate an array of binary values based on one or more analog inputs according to a selectable binarization function may be referred to as a reconfigurable binary generator array. Note that a circuit for generating an array of binary values based on an array of input analog signals may be realized using any other implementations known in the art and the description presented herein is for illustration purposes and does not limit the scope of the present teaching.

Figure 7:
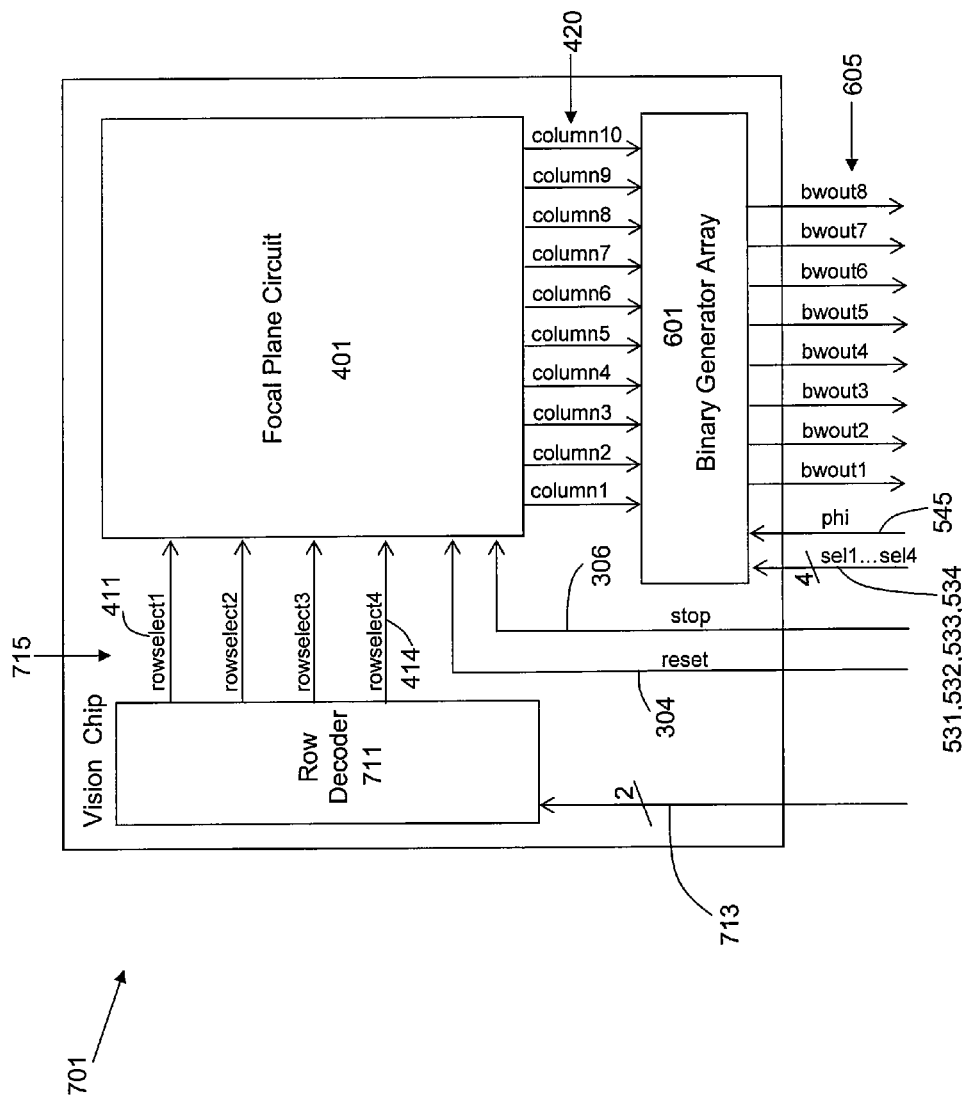
FIG. 7 illustrates the schematic of an exemplary feature detecting vision chip.

Refer to FIG. 7, which illustrates the schematic of an exemplary feature detecting vision chip 701. As described above, a vision chip is an imaging chip having both photoreceptor circuits and image processing circuits on the same die. A vision chip may be mounted at a position with respect to an optical assembly, such as a lens, to grab an image from a field of view visible by the optical assembly and the vision chip.

The exemplary feature detecting vision chip 701 comprises three elements, a row decoder circuit 711, the focal plane circuit 401 of FIG. 4, and the reconfigurable binary generator array 601 of FIG. 6. The row decoder circuit 711 receives as input a two-bit row command signal 713 and generates the array of row select signals rowselect1 411 through rowselect4 414 based on the row command signal 713. The focal plane circuit 401 receives as input the row select signals rowselect1 411 through rowselect4 414, reset 304, and stop 306. The focal plane circuit 401 also generates as an output the array of photoreceptor signals 420. The reconfigurable binary generator array 601 receives as input the array of photoreceptor detector signals 420 and generates an array of binarized photoreceptor signals 605. The reconfigurable binary generator array 601 also receives as input the switch signals sel1 531 through sel4 534 and the signal phi 545.

In the exemplary feature detecting vision chip 701 the row command signal 713 contains an index number to select an individual row. For example the pattern "00" may indicate that rowselect1 is turned on, "01" may indicated that rowselect2 is turned on, and so forth. The row decoder 711 may be implemented with a decoder circuit.

The exemplary feature detecting vision chip 701 may be modified by changing the size of the arrays or by utilizing different versions of pixel circuits, and/or reconfigurable binary generator arrays.

The exemplary feature detecting vision chip 701 may be operated to generate an array of binarized photoreceptor signals for each row of the focal plane circuit 401. First the external resetting signal reset 304 is pulsed to reset the focal plane circuit 401 and begin the integration interval. Second the external sampling signal stop 306 is pulsed to force the end of all ongoing integration intervals. Then the rowselect1 411 line is set high to select the first row of the focal plane circuit 401. Then the reconfigurable binary generator array 601 is operated to generate binarized photoreceptor signals based on the photoreceptor signals from the first row. Then the second row of the focal plane circuit 401 is selected, and an array of binarized photoreceptor signals is generated based on the second row's photoreceptor signals. The remaining rows of the focal plane circuit 401 may be processed in this manner. The resulting binarized photoreceptor signals from all four rows form a two dimensional array of binary values that may be referred to as a binarized image. Another binarized image may be generated by operating the reconfigurable binary generator array 601 to implement a different binarization function. A collection of binarized images generated using different binarization functions may also collectively be referred to as a binarized image.

Note that a feature detecting vision chip may be realized using any other implementations known in the art and the description presented herein is for illustration purposes and does not limit the scope of the present teaching.

One modification to the vision chip 701 is to utilize one or more winner-takes-all circuits in place of the exemplary binary generator array 601. A winner-takes-all circuit is a circuit that receives as input an array of analog inputs and generates an array of binary outputs, with one digital level, usually but not necessarily a digital "1", corresponding to the analog inputs that are the most positive, and the other digital level used for the other outputs. Such winner-takes-all circuits are described in U.S. Pat. Nos. 6,020,953 and 6,384,905. For example, a five-input winner-takes-all circuit may receive as input the analog voltage levels 2.5, 2.8, 3.0, 2.4, and 1.9, and output a corresponding digital pattern 00100. The winner-takes-all circuit may be configured to receive as input photoreceptor signals, and the output generated by the winner-takes-all circuit would be used as the binarized signals. Any of the winner-takes-all variants of U.S. Pat. No. 6,020,953 may be used, including but not limited to winner-take-all circuits, k winners-take-all circuits, local winners-take-all circuits, k-local winners-take-all circuits, and the generalized winner-take-all circuit. Corresponding "loser-take-all" circuits that identify input signals that are the least positive may also be used. Another possible winner-takes-all circuit that may be used is depicted in FIGS. 8A and 8B of U.S. Pat. No. 6,384, 905.

Depending on the number of photoreceptor signals that need to be binarized, it may be useful to use multiple smaller winner-takes-all circuits in place of a single larger one. For example, if there are 15 photoreceptor signals, rather than using a single 15-input winner-takes-all circuit, it may be preferable to use three five-input winner-takes-all circuits. The first winner-takes-all circuit would process photoreceptor signals 1 through 5, the second photoreceptor signals 6 through 10, and the third photoreceptor signals 11 through 15. The act of computing an array of binarized signals from an array of photoreceptor signals using any winner-takes-all circuit variant may be referred to as "computing a winner-takes-all function", whether this is performed in hardware or software.

As a further generalization, the exemplary binary generator array 601 may be replaced with any circuit that generates an array of binary signals based on an input array of analog signals. Note that a binary generator circuit may be realized using any other implementations known in the art and the description presented herein is for illustration purposes and does not limit the scope of the present teaching.

Figure 8:
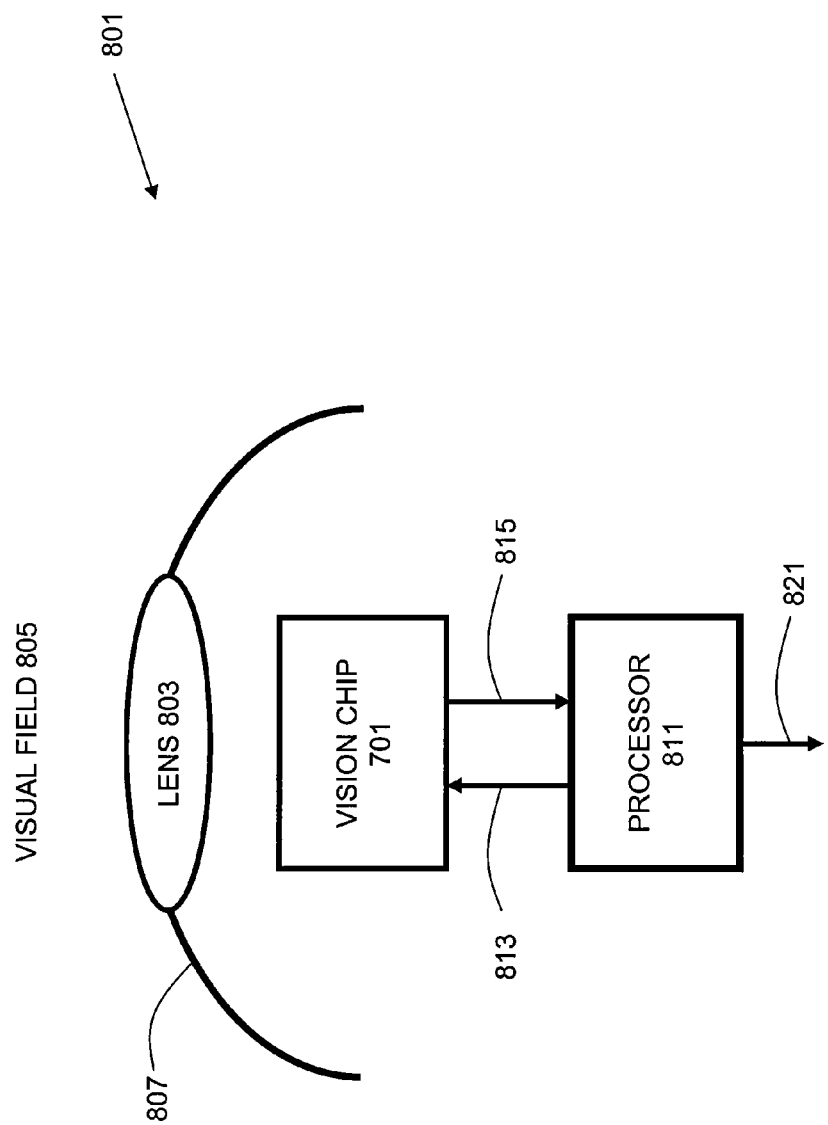
FIG. 8 illustrates an exemplary machine vision system incorporating a feature detecting vision chip.

A processor may be connected to the vision chip 701 to form a machine vision system. Refer to FIG. 8, which illustrates an exemplary machine vision system 801 incorporating the exemplary feature detecting vision chip 701 of FIG. 7. A machine vision system is defined as any system that grabs an image based on the environment, processes the image, and generates an output based on the grabbed image. A lens 803 or another optical apparatus (such as a pinhole, mirror, or lens assembly) may be used to focus light from the visual field 805 to form an image on the vision chip 701. The visual field 805 is defined as the region of the environment that is visible by the vision chip 701 as a result of the position of the vision chip 701 and the lens 803 and the size of the vision chip 701. The lens 803 or other optical apparatus may be supported by an optical enclosure 807 which holds the lens 803 at a predetermined distance from the vision chip 701 and prevents stray light from striking the vision chip 701. A processor 811 is electrically connected to the vision chip 701. A set of electrical signals 813 is generated by the processor 811 and sent to the vision chip 701. These signals 813 may include row command signals 713, switch signals sel1 531 through sel4 534, the signal phi 545, and signals reset 304 and stop 306. The processor 811 may also receive signals 815 from the vision chip 701, which may include the binarized photoreceptor signals 605 or a binarized image generated by the reconfigurable binary generator array 601.

The processor 811 may be programmed to generate an output 821 based on the data generated by the vision chip 701. If the processor 811 is programmed to sense visual motion and/or optical flow, and generate measurements based on the visual motion and/or optical flow, then the machine vision system 801 may be referred to as an optical flow sensor. The processor 811 may also be programmed to merely transfer the binarized photoreceptor signals to a system hosting the machine vision system 801.

The processor 811 may be a microcontroller, a digital signal processor (DSP), a microprocessor, or any other device that processes information. The processor may be a device that generates switch signals sel1 531 through sel4 534, phi 545, reset 304, and stop 306, and generates an output 821 based on the vision chip output. The processor may optionally be embedded on the vision chip 701.

The bias signals nbias 409, vref 651, and any other required bias signals may be generated on or off the vision chip 701, and may be generated using a resistor network or any other appropriate bias voltage generator. Note that a machine vision system incorporating a vision chip may be realized using any other implementations known in the art and the description presented herein is for illustration purposes and does not limit the scope of the present teaching.

Optionally, the processor 811 and the vision chip 701 may be configured so that the photoreceptor signals 420 are sampled and digitized for later use. This may require an analog multiplexer and/or a separate analog to digital converter (ADC).

Next is discussed several modifications that may be made to the above exemplary embodiment of a visual sensor. These modifications may be implemented individually or together.

The term "optical flow" generally refers to the apparent motion of texture seen by an agent (such as an animal or a robot) as a result of relative motion between the agent and other objects in the environment. It is well known that animals, especially insects, use information from optical flow for depth perception and navigating through an environment without colliding into obstacles. An introduction to the concept of optical flow may be found in the book "The Ecological Approach to Visual Perception", by J. Gibson, published by Lawrence Erlbaum Associates in 1986. Some examples of how insects utilize optical flow for navigation may be found in issue 199(1) of the Journal of Experimental Biology, edited by Wehner, Lehrer, and Harvey, and published in 1996 by The Company of Biologists Limited. Robotics and machine vision researchers have borrowed from these examples in biology to build machine vision systems that use optical flow for depth perception and obstacle avoidance in real environments. Examples of how optical flow may be used to perform some robotic tasks may be found in the paper "Biological Inspired Visual Sensing and Flight Control" by Barrows, Chahl, and Srinivasan, which appeared in the March 2003 issue of The Aeronautical Journal published by The Royal Aeronautical Society. Many other examples may be found in the academic literature.

The term "optical flow" is generally described in the academic literature as a vector field, with the domain of the vector field equal to the spherical visual field and the vectors representing the apparent velocity of visual texture in the visual field. In this document, the term "optical flow" will be used in a broader sense to include all types of visual motion that may be measured.

The machine vision system 801 may be modified to form an optical flow sensor. The processor 811 would receive as input the binarized signals 605 generated by the binary generator array 601 and/or the photoreceptor signals 420 generated by the focal plane circuit 401. The processor 811 may would then be programmed with optical flow algorithms capable of generating one or more optical flow measurements as an output 821 based on the binarized signals 605 and/or the photoreceptor signals 420. A variety of optical flow algorithms may be utilized for this purpose. Sample algorithms include algorithms described in U.S. Pat. Nos. 6,020,953 and 6,384,905. Many other optical flow algorithms found in the art, such as block matching, may be used. Note that an optical flow sensor incorporating a vision chip may be realized using any other implementations known in the art and the description presented herein is for illustration purposes and does not limit the scope of the present teaching.

A modified version of the vision chip 701 may be constructed by replacing the focal plane circuit 401 with a 4-by-10 version of the prior art focal plane array 101 of FIG. 1. The photoreceptor signals generated by the focal plane array would then be provided to the binary generator array 601, which would then generate the binarized photoreceptor signals 605 based on the photoreceptor signals. This alternative vision chip may be incorporated into the machine vision system 801 of FIG. 8, and may be used to construct an optical flow sensor.

A weakness of this alternative vision chip is that it may not have the same light intensity dynamic range as the vision chip 701 of FIG. 7, because it may lack pixel fields having the ability to select their own independent integration interval. However a solution to this problem is to grab two or more images for each frame, with one image grabbed using a short integration interval and another image grabbed using a longer integration interval, and so forth. Any machine vision algorithms implemented on the photoreceptor signals or the binarized photoreceptor signals may then be modified to handle the sections of each image that are overexposed or underexposed. For example suppose in a first set of images grabbed with one integration interval there are overexposed or underexposed portions of the set of images grabbed and as a result motion is not detectable in these regions. A second set of images grabbed with a shorter integration interval may then detect motion in regions that are overexposed in the first set of images. Likewise a third set of images grabbed with a longer integration interval may then detect motion in regions that are underexposed in the first set of images.

While the inventions have been described with reference to the certain illustrated embodiments, the words that have been used herein are words of description, rather than words of limitation. Changes may be made, within the purview of the appended claims, without departing from the scope and spirit of the invention in its aspects. Although the inventions have been described herein with reference to particular structures, acts, and materials, the invention is not to be limited to the particulars disclosed, but rather can be embodied in a wide variety of forms, some of which may be quite different from those of the disclosed embodiments, and extends to all equivalent structures, acts, and, materials, such as are within the scope of the appended claims.

I claim:

1. A visual sensor comprising:
   a plurality of pixel circuits generating a plurality of potentials based on a visual field, a reset signal, and a sample signal, and generating a plurality of photoreceptor signals based on the plurality of potentials;
   a plurality of pixel saturation detection circuits generating a plurality of pixel saturation signals based on the plurality of potentials;
   a field saturation detection circuit generating a field saturation signal based on the plurality of pixel saturation signals; and
   a control circuit generating the sample signal based on the field saturation signal, wherein the sample signal controls a time of sampling of the plurality of pixel circuits of the field.

2. The visual sensor of claim 1, wherein the plurality of pixel saturation detection circuits comprises a plurality of voltage level detection circuits generating the plurality of pixel saturation signals based on the plurality of potentials.

3. The visual sensor of claim 2, wherein the plurality of pixel saturation signals are digital.

4. The visual sensor of claim 1, wherein the plurality of pixel saturation detection circuits comprise a plurality of inverters.

5. The visual sensor of claim 1, wherein the plurality of pixel saturation detection circuits comprise a plurality of comparators.

6. The visual sensor of claim 1, wherein the plurality of pixel circuits, the plurality of pixel saturation detection circuits, the field saturation detection circuit, and the control circuit are implemented on an integrated circuit.

7. The visual sensor of claim 1, further comprising a binary generator array generating a plurality of binarized signals based on the plurality of photoreceptor signals.

8. The visual sensor of claim 7, wherein the binary generator array is associated with at least one of a switched capacitor circuit and a winner takes all circuit.

9. The visual sensor of claim 7, further comprising a processor generating an optical flow measurement based on the plurality of binarized signals.

10. A vision chip comprising:
    a plurality of fields,
    wherein each field of the plurality of fields comprises:
      a plurality of pixel circuits associated with the field, the pixels circuits generating a plurality of potentials associated with the field based on a visual field, a sample signal associated with the field, and a reset signal, and generating a plurality of photoreceptor signals associated with the field based on the plurality of potentials associated with the field; and
      a control circuit associated with the field and generating the sample signal associated with the field based on the plurality of potentials associated with the field, wherein the sample signal controls a time of sampling of all pixel circuits of the plurality of pixel circuits of the field;
    wherein the vision chip is implemented on one integrated circuit.

11. The vision chip of claim 10, wherein each field of the plurality of fields further comprises:
    a field saturation detection circuit associated with the field and generating a field saturation signal associated with the field based on the plurality of potentials associated with the field; wherein
    the control circuit associated with the field generates the sample signal associated with the field based additionally on the field saturation signal associated with the field.

12. The vision chip of claim 11, wherein each field of the plurality of fields further comprises:
    a plurality of pixel saturation detection circuits associated with the field and generating a plurality of pixel saturation signals associated with the field based on the plurality of potentials associated with the field; wherein
    the field saturation detection circuit associated with the field generates the field saturation signal associated with the field based additionally on the plurality of pixel saturation signals associated with the field.

13. The vision chip of claim 12, wherein for each field of the plurality of fields:
    the plurality of pixel saturation detection circuits associated with the field comprise a plurality of voltage level detection circuits associated with the field and generating the plurality of pixel saturation signals associated with the field based on the plurality of potentials associated with the field.

14. The vision chip of claim 13, wherein for each field of the plurality of fields:
    the plurality of pixel saturation signals associated with the field are digital.

15. The vision chip of claim 12, wherein for each field of the plurality of fields:

the plurality of pixel saturation detection circuits associated with the field comprise a plurality of inverters.

16. The vision chip of claim 12, wherein for each field of the plurality of fields:
The plurality of pixel saturation detection circuits associated with the field comprise a plurality of comparators.

17. The vision chip of claim 11, further comprising a processor executing a program, wherein for each field of the plurality of fields:
the control circuit associated with the field is implemented by the processor executing the program.

18. The vision chip of claim 10, further comprising at least one binary generator array, wherein for each field of the plurality of fields:
the at least one binary generator array generates a plurality of binarized signals associated with the field based on the plurality of photoreceptor signals associated with the field.

19. The vision chip of claim 18, wherein the at least one binary generator array is associated with at least one of a switched capacitor circuit and a winner takes all circuit.

20. The vision chip of claim 18, further comprising a processor generating an optical flow measurement based on the plurality of binarized signals associated with each field of the plurality of fields.

* * * * *